United States Patent
Chen

(10) Patent No.: US 8,471,549 B2
(45) Date of Patent: Jun. 25, 2013

(54) POWER DETECTOR

(75) Inventor: Chih-Wei Chen, Taipei (TW)

(73) Assignee: RichWave Technology Corp., NeiHu District, Taipei (TW)

( * ) Notice: Subject to any disclaimer, the term of this patent is extended or adjusted under 35 U.S.C. 154(b) by 479 days.

(21) Appl. No.: 12/776,420

(22) Filed: May 9, 2010

(65) Prior Publication Data

US 2011/0273162 A1    Nov. 10, 2011

(51) Int. Cl.
*G01R 1/30*    (2006.01)

(52) U.S. Cl.
USPC .................................................. 324/123 R

(58) Field of Classification Search
USPC .......... 324/762.01–762.1, 123 R; 438/14–18; 330/285, 296, 140, 278–279
See application file for complete search history.

(56) References Cited

U.S. PATENT DOCUMENTS

| 7,042,285 | B2 * | 5/2006 | Parkhurst et al. ............. 330/140 |
| 7,564,311 | B2 * | 7/2009 | Rohani et al. ................. 330/285 |
| 2005/0237110 | A1 | 10/2005 | Parkhurst |
| 2009/0085669 | A1 | 4/2009 | Rohani |

FOREIGN PATENT DOCUMENTS

| TW | 200843337 | 11/2008 |
| TW | 200843340 | 11/2008 |

* cited by examiner

*Primary Examiner* — Tung X Nguyen
(74) *Attorney, Agent, or Firm* — Winston Hsu; Scott Margo

(57) ABSTRACT

A power detector circuit for measuring output power of an amplifier circuit includes a mirror amplification stage having mirror circuit components substantially similar and corresponding to original circuit components of an amplification stage of the amplifier circuit, and a power sensor circuit coupled to an output node of the mirror amplification stage.

18 Claims, 4 Drawing Sheets

POWER DETECTOR

BACKGROUND OF THE INVENTION

1. Field of the Invention

The present invention relates to power detectors, and more particularly to a power detector using a mirror cell.

2. Description of the Prior Art

A power amplifier is a type of electronic circuit that converts a low-power signal into a signal of higher power. The power amplifier is typically applied as a last amplifier in a transmission circuit. For example, a mobile phone antenna may be driven by a power amplifier for emitting a radio frequency (RF) call signal at a power level sufficient for communicating with a base station located anywhere from 400 yards away to as far as 20 or more miles away.

In order to ensure transmission of a clean, linear signal at an appropriate power level, while maintaining power efficiency, a power detector is typically coupled to the power amplifier for detecting output power of the power amplifier. The power detector is generally coupled directly to a node of the power amplifier located between the output of a final amplification stage of the power amplifier and the input of an antenna. The power detector is usually coupled in front of an output matching circuit, but may also be coupled after the output matching circuit.

In the configuration described above, the power detector causes many design problems. First, performance of the output amplification stage is affected by the power detector. Output-matching, gain optimization, and linearity optimization become significantly complicated. Second, performance of the power detector is affected by the output load of the final amplification stage. In modern communications systems, power detection should be independent of system or environmental voltage standing wave ratio (VSWR). However, the power detector senses both the amplified output signal and a reflected signal from external circuitry. Thus, the power detector output is very sensitive to output-loading variations and/or impedance mismatch between the final amplification stage and the external circuitry, which induces significant dependence on system VSWR.

SUMMARY OF THE INVENTION

According to one embodiment, a power detector circuit for measuring output power of an amplifier circuit comprises a mirror amplification stage comprising a plurality of mirror circuit components substantially similar and corresponding to a plurality of original circuit components of an amplification stage of the amplifier circuit, and a power sensor circuit coupled to an output node of the mirror amplification stage.

According to another embodiment, an electronic circuit comprises an amplification stage, and a power detector circuit for measuring output power of the amplification stage. The power detector circuit comprises a mirror amplification stage comprising a plurality of mirror circuit components substantially similar and corresponding to a plurality of original circuit components of the amplification stage, and a power sensor circuit coupled to an output node of the mirror amplification stage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
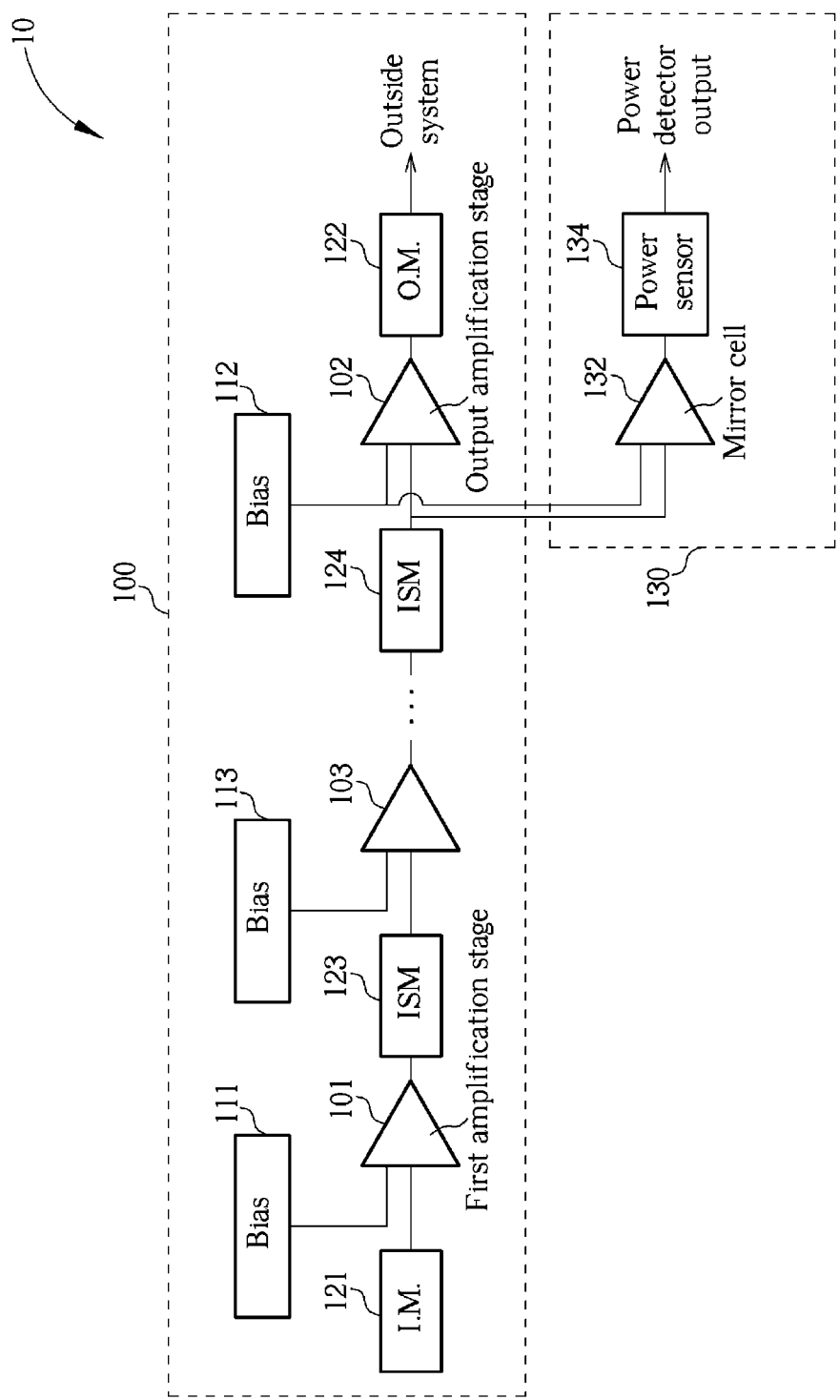
FIG. 1 is a diagram of an amplifier circuit with a power detector circuit according to one embodiment.

Please refer to FIG. 1, which is a diagram of an amplifier circuit 10 with a power detector circuit 130 according to one embodiment. The amplifier circuit 10 comprises an amplifier chain 100, and the power detector circuit 130. The amplifier chain 100 comprises a first amplification stage 101 and an output amplification stage 102. The amplifier chain 100 may further comprise a plurality of intermediate amplification stages 103. The first amplification stage 101, the intermediate amplification stages 103, and the output amplification stage 102 may be arranged in an amplification chain, where an output of the first amplification stage 101 is coupled to an input of the intermediate amplification stages 103, and an output of the intermediate amplification stages 103 is coupled to an input of the output amplification stage 102. The first amplification stage 101 is biased by a first bias circuit 111. An input terminal of the first amplification stage 101 may be preceded by an input matching circuit 121. The output amplification stage 102 is biased by an output bias circuit 112. An output terminal of the output amplification stage 102 may be followed by an output matching circuit 122, and an input terminal of the output amplification stage 102 may be preceded by an inter-stage matching circuit 124. The intermediate amplification stage 103 is biased by an intermediate bias circuit 113, and may be preceded by an inter-stage matching circuit 123. Each matching circuit 121, 122, 123, and 124 may provide impedance matching between the circuit preceding the matching circuit and the circuit following the matching circuit.

The power detector circuit 130 comprises a mirror cell 132 and a power sensor 134 coupled to an output terminal of the mirror cell 132. The mirror cell 132 is biased by the output bias circuit 112, and has an input terminal coupled to the input terminal of the output amplification stage 102. The mirror cell 132 comprises a plurality of mirror circuit components substantially similar and corresponding to a plurality of original circuit components of the output amplification stage 102 of the amplifier chain 100. Each mirror circuit component of the plurality of mirror circuit components may be of substantially similar size to the corresponding original circuit component of the plurality of original circuit components. Each mirror circuit component of the plurality of mirror circuit components may be of size substantially proportional to the corresponding original circuit component of the plurality of original circuit components. The output amplification stage 102 may comprise a metal-oxide-semiconductor (MOS) transistor having characteristics, such as width and length. The mirror cell 132 may comprise a MOS transistor having width equal to the width of the MOS transistor of the output amplification stage 102. Or, the width of the MOS transistor of the mirror cell 132 may be a ratio of the width of the MOS transistor of the output amplification stage 102. The width of the MOS transistor of the mirror cell 132 may be shorter than the width of the MOS transistor of the output amplification stage 102. Width of MOS transistors is often measured in fingers. The MOS transistor of the mirror cell 132 may have fewer fingers than the width of the MOS transistor of the output amplification stage 102. Ratio of the widths may be designed according to design requirements.

Figure 2:
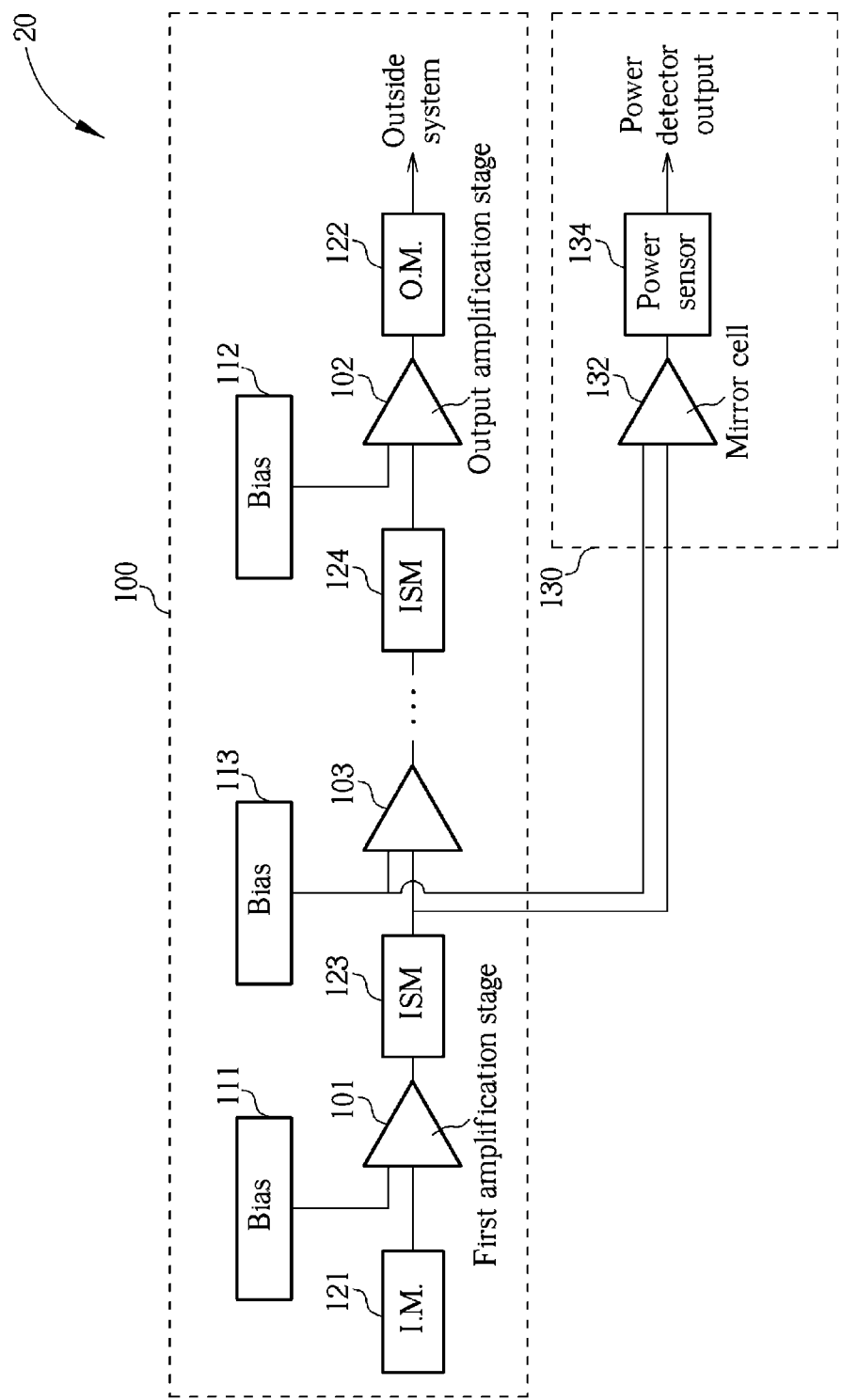
FIG. 2 is a diagram of an amplifier circuit with a power detector circuit according to another embodiment.

Please refer to FIG. 2, which is a diagram of an amplifier circuit 20 with the power detector circuit 130 according to another embodiment. The amplifier circuit 20 comprises the amplifier chain 100, and the power detector circuit 130. In the embodiment shown in FIG. 2, the power detector circuit 130 comprises the mirror cell 132 and the power sensor 134 coupled to the output terminal of the mirror cell 132. The mirror cell 132 is biased by an intermediate bias circuit 113, and the input terminal of the mirror cell 132 is coupled to the input terminal of an intermediate amplification stage 103. The mirror cell 132 comprises a plurality of mirror circuit components substantially similar and corresponding to a plurality of original circuit components of the intermediate amplification stage 103 of the amplifier chain 100. Each mirror circuit component of the plurality of mirror circuit components may be of substantially similar size to the corresponding original circuit component of the plurality of original circuit components. Each mirror circuit component of the plurality of mirror circuit components may be of size substantially proportional to the corresponding original circuit component of the plurality of original circuit components. The intermediate amplification stage 103 may comprise a metal-oxide-semiconductor (MOS) transistor having characteristics, such as width and length. The mirror cell 132 may comprise a MOS transistor having width equal to the width of the MOS transistor of the intermediate amplification stage 103. Or, the width of the MOS transistor of the mirror cell 132 may be a ratio of the width of the MOS transistor of the intermediate amplification stage 103. The width of the MOS transistor of the mirror cell 132 may be shorter than the width of the MOS transistor of the intermediate amplification stage 103. Width of MOS transistors is often measured in fingers. The MOS transistor of the mirror cell 132 may have fewer fingers than the width of the MOS transistor of the intermediate amplification stage 103. Ratio of the widths may be designed according to design requirements.

Figure 3:
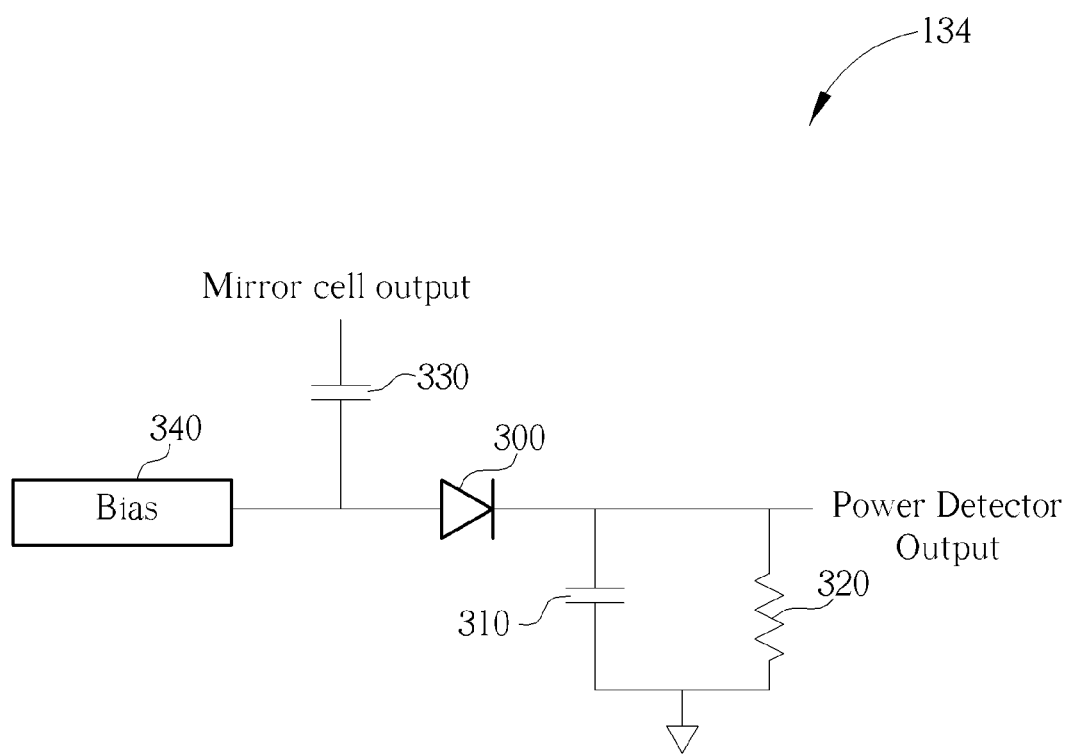
FIG. 3 is a diagram of a power sensor circuit of the power detector circuit of FIG. 1 and FIG. 2.

Please refer to FIG. 3, which is a diagram of the power sensor circuit 134 of the power detector circuit 130 of FIG. 1 and FIG. 2. The power sensor circuit 134 comprises an input terminal for receiving output power of the mirror cell 132, an input capacitor 330 for providing power coupling, a diode circuit, a filtering capacitor 310, and a filtering resistor 320 for measuring the output power. The power sensor circuit 134 also comprises a bias circuit 340 for biasing the diode circuit 300. The power detector circuit 130 receives the coupled output power of the mirror cell 132, and outputs a detection signal in voltage, current, and/or other analog form.

Figure 4:
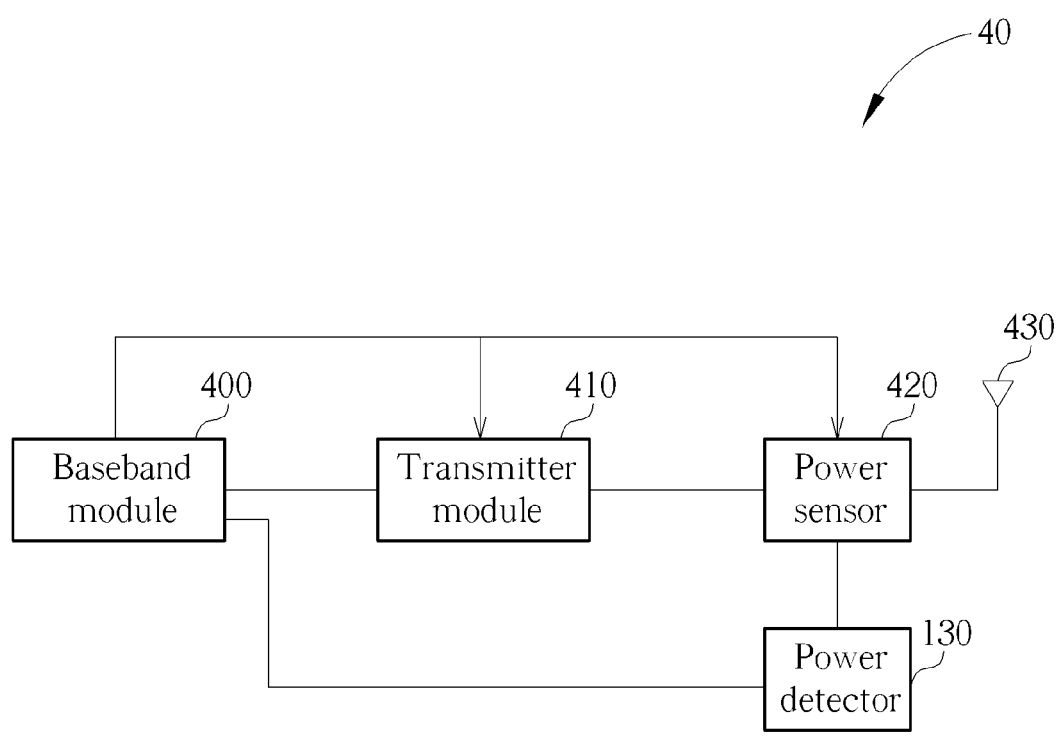
FIG. 4 is a diagram of a transmitter circuit with a power detector circuit.

Please refer to FIG. 4, which is a diagram of a transmitter circuit 40 with the power detector circuit 130. The transmitter circuit 40 comprises a baseband module 400, a transmitter module 410, a power amplifier 420, an antenna 430, and the power detector circuit 130. The baseband module 400 generates a signal, which is transmitted to the transmitter module 410 for conversion to analog and upconversion to radio frequency before being amplified by the power amplifier 420 for transmission by the antenna 430. The power detector circuit 130 detects power level of the power amplifier 420, and sends a detection signal corresponding to the power level to the baseband module 400. The baseband module 400 controls biasing of the power amplifier 420 and/or the transmitter module 410 according to the detection signal. In this way, a feedback loop may be formed for optimizing performance of the transmitter circuit 40.

The power detector circuit 130 may output the detection signal to a power-reading node of the baseband module 400, a transceiver module, an analog-to-digital converter (ADC), or any other circuit or system that performs system calibration according to output power of the transmitter circuit 40. Because the mirror cell 132 has the same bias as the corresponding amplification stage, output power of the mirror cell 132 directly mirrors output power of the corresponding amplification stage, providing accurate measure of the output power. Use of the mirror cell 132 allows for significant weakening of the relationship between the power detector circuit 130 and the corresponding amplification stage. The power detector circuit 130 is not seen by the corresponding amplification stage, and the corresponding amplification stage is not seen by the power detector circuit 130. Thus, amplification and linearity of the corresponding output stage, are independent of the power detector circuit 130, simplifying design of the output matching circuit 122, as well as harmonics canceling and reflection reduction. Further, the power sensor circuit 134 is not coupled to the corresponding amplification stage, preventing the power sensor circuit 134 from sensing reflected signal from the external circuit, making the detection signal stable in the presence of impedance variation and/or VSWR variation.

Those skilled in the art will readily observe that numerous modifications and alterations of the device and method may be made while retaining the teachings of the invention.

What is claimed is:

1. A power detector circuit for measuring output power of an amplification stage of an amplifier circuit, the power detector circuit comprising:
 a mirror cell for receiving an input of the amplification stage to generate an output thereof which mirrors an output of the amplification stage; and;
 a power sensor circuit for receiving the output of the mirror cell to measure the output power of the amplification stage.

2. The power detector circuit of claim 1, wherein the mirror cell and the amplification stage are biased by a same voltage bias source.

3. The power detector circuit of claim 1, wherein the mirror cell comprising a plurality of components substantially similar and corresponding to a plurality of original components of the amplification stage of the amplifier circuit.

4. The power detector circuit of claim 1, wherein the power sensor circuit comprises a diode circuit and a filter.

5. The power detector circuit of claim 3, wherein each component of the plurality of components is of substantially similar size to the corresponding original component of the plurality of original components.

6. The power detector circuit of claim 3, wherein each component of the plurality of components is of size substantially proportional to the corresponding original component of the plurality of original components.

7. The power detector circuit of claim 1, wherein the amplification stage is an output stage of the amplifier circuit.

8. The power detector circuit of claim 1, wherein the amplification stage is an intermediate amplification stage of the amplifier circuit.

9. An electronic circuit comprising:
 an amplification stage; and
 a power detector circuit for measuring output power of the amplification stage, the power detector circuit comprising:
   a mirror cell receiving an input of the amplification stage to generate an output thereof which mirrors an output of the amplification stage; and
   a power sensor circuit for receiving the output of the mirror cell to measure the output power of the amplification stage.

10. The electronic circuit of claim 9, wherein the mirror cell and the amplification stage are biased by a same voltage bias source.

11. The electronic circuit of claim 9, wherein the mirror cell comprising a plurality of components substantially similar and corresponding to a plurality of original components of the amplification stage.

12. The electronic circuit of claim 9, wherein the power sensor circuit comprises a diode circuit.

13. The electronic circuit of claim 11, wherein each component of the plurality of components is of substantially similar size to the corresponding original component of the plurality of original components.

14. The electronic circuit of claim 11, wherein each component of the plurality of components is of size substantially proportional to the corresponding original component of the plurality of original components.

15. The electronic circuit of claim 9, wherein the amplification stage is an output stage of the electronic circuit.

16. The electronic circuit of claim 9, wherein the amplification stage is an intermediate amplification stage of the electronic circuit.

17. The electronic circuit of claim 9, further comprising a matching circuit coupled to an output of the amplification stage.

18. The electronic circuit of claim 9, further comprising an inter-stage matching circuit coupled to an input terminal of the amplification stage and an input terminal of the mirror cell.

\* \* \* \* \*